United States Patent
Rood et al.

(10) Patent No.: US 10,971,909 B1
(45) Date of Patent: Apr. 6, 2021

(54) INTERCHANGEABLE DRIVER POWER SYSTEM

(71) Applicant: Elemental LED, Inc., Reno, NV (US)

(72) Inventors: Bret Edward Rood, Reno, NV (US); Michael Benjamin Goodman, Reno, NV (US)

(73) Assignee: Elemental LED, Inc., Reno, NV (US)

( * ) Notice: Subject to any disclaimer, the term of this patent is extended or adjusted under 35 U.S.C. 154(b) by 0 days.

(21) Appl. No.: 17/092,055

(22) Filed: Nov. 6, 2020

(51) Int. Cl.
| | | |
|---|---|---|
| *H02G 3/08* | (2006.01) | |
| *H02G 15/10* | (2006.01) | |
| *H02G 3/16* | (2006.01) | |
| *H05K 5/03* | (2006.01) | |
| *H05K 5/02* | (2006.01) | |
| *H02G 3/10* | (2006.01) | |

(52) U.S. Cl.
CPC .............. *H02G 3/083* (2013.01); *H02G 3/10* (2013.01); *H02G 3/16* (2013.01); *H02G 15/10* (2013.01); *H05K 5/0204* (2013.01); *H05K 5/0221* (2013.01); *H05K 5/0247* (2013.01); *H05K 5/03* (2013.01)

(58) Field of Classification Search
CPC ........... H02G 3/083; H02G 3/10; H02G 3/16; H02G 15/10; H02G 3/08; H02G 3/081; H02G 3/085; H05K 5/00; H05K 5/02; H05K 5/0204; H05K 5/03; H05K 5/0221; H05K 5/0247; H01R 13/46

USPC ........ 174/480, 481, 50, 53, 57, 58, 60, 520, 174/535; 220/3.2–3.9, 4.02; 361/600, 361/601, 602, 641
See application file for complete search history.

(56) References Cited

U.S. PATENT DOCUMENTS

| | | | | |
|---|---|---|---|---|
| 3,885,852 | A * | 5/1975 | Grove | H02G 3/18 439/441 |
| 5,747,734 | A * | 5/1998 | Kozlowski | H02B 1/305 174/37 |
| 6,937,461 | B1 * | 8/2005 | Donahue, IV | H01R 27/02 361/622 |
| 7,598,461 | B2 * | 10/2009 | Kitamura | H05K 7/1421 174/520 |
| 9,258,919 | B1 * | 2/2016 | Rose | H01R 24/20 |
| 9,951,934 | B2 * | 4/2018 | Buck | H02G 15/10 |
| 10,116,127 | B1 * | 10/2018 | Lopez-Martinez | H02G 3/085 |
| 10,622,794 | B1 * | 4/2020 | Holleschau | H01H 9/0044 |

* cited by examiner

*Primary Examiner* — Angel R Estrada
(74) *Attorney, Agent, or Firm* — United IP Counselors, LLC

(57) ABSTRACT

Interchangeable driver systems including at least a driver and a receptacle are disclosed. The receptacle provides a compartment, space, or other connection point for a power input as well as connecting structure that releasably and interchangeably connects to the driver. The driver has complementary electrical and mechanical connecting structure. The electrical and mechanical connections between the driver and the receptacle are such that when a mechanical connection between them is made, an electrical connection is also made. The receptacle may take the form of an enclosure that surrounds a substantial portion of the driver, or it may take the form of a short base with a socket that receives a connecting portion of the driver.

20 Claims, 7 Drawing Sheets

INTERCHANGEABLE DRIVER POWER SYSTEM

TECHNICAL FIELD

The invention relates to drivers that convert power from one form to another to provide power for electronics, and more particularly to systems for installing such drivers.

BACKGROUND

A driver is a component that takes power in a first form and outputs power in a second form, different from the first. Ubiquitous in modern consumer electronics, drivers are most frequently used to convert high-voltage, alternating-current (AC) power to low-voltage, direct-current (DC) power, although AC-to-AC, DC-to-DC, and other forms of power conversion are also sometimes seen. The switched-mode power supply is one common type of driver used for AC-to-DC power conversion, but other types of drivers are also used.

Drivers are unloved. Referred to derisively as bricks, wall worts, and worse, they can be inconvenient to install and to use. For example, during the installation of a low-voltage DC electrical product like linear lighting, the installer must plan out how much power each part of the system requires, find compatible drivers, and provide space to install those drivers at appropriate locations. Installers are required to be ever more creative with their placement of drivers, and if the power utilization calculations for the system are off, the installer may need to remove and replace the drivers with different models, at significant expense. Drivers also frequently fail, and replacement after installation may mean tearing holes in drywall, opening barely-accessible raceways and compartments, or otherwise undoing whatever creative contortions the installer went through to install the drivers in the first place.

More difficult is that, because of local fire and safety codes, drivers must usually be placed within junction boxes, with any electrical connections made within the junction boxes. A junction box is an enclosure, usually metal or plastic, designed to prevent the spread of sparks or flame in the event of an electrical short, overload, or other such problem. Installing a junction box requires an intricate series of steps to place the box, secure a driver in the box, and make electrical connections to the driver.

Drivers come in a wide variety of sizes and with a wide variety of characteristics. Generally speaking, the more power a driver is adapted to provide, the larger the driver. There have been some efforts to construct "universal" junction boxes that can accept a variety of different sizes of driver and make it easier to make electrical connections to the driver. For example, U.S. Pat. No. 9,951,934, the work of the present assignee and incorporated by reference in its entirety, discloses a universal junction box with wide, open areas that make it easier to install a driver and to make electrical connections to it. While this patent may make certain parts of driver installation easier, installation is still not easy.

BRIEF SUMMARY

Aspects of the invention relate to interchangeable driver systems. These systems include at least a driver and a receptacle. The receptacle provides a compartment, space, or other connection point for a power input as well as connecting structure that releasably and interchangeably connects to the driver. The driver has complementary electrical and mechanical connecting structure. The electrical and mechanical connections between the driver and the receptacle are such that when a mechanical connection between them is made, an electrical connection is also made.

In some embodiments according to this aspect of the invention, the receptacle may be relatively large, such that it receives and surrounds a substantial portion of the driver, or the entirety of it. In other embodiments, the receptacle may take the form of a short base with a socket that receives a connecting portion of the driver.

In a typical installation, the receptacle may be installed and connected to an input power source using wire connections within the compartment or space it provides for such connections. The driver would then be pushed or snapped into place within the receptacle. Drivers would generally be sized and configured such that, regardless of their power handling capacities or other technical characteristics, a variety of drivers can connect with the same receptacle. Among other things, this would allow drivers of appropriate capacities and other characteristics to be selected, installed, and replaced long after the basic electrical infrastructure defined by the receptacles is installed.

The receptacles may also have electrical connecting structure that allows them to connect to one another, such that several receptacles may be connected to one another in a bank of receptacles. If this is done, one receptacle may be connected to input power, and the other receptacles may draw input power from that one receptacle.

Other aspects, features, and advantages of the invention will be set forth in the description that follows.

BRIEF DESCRIPTION OF THE DRAWING FIGURES

The invention will be described with respect to the following drawing figures, in which like numerals represent like features throughout the description, and in which.

DETAILED DESCRIPTION

Figure 1:
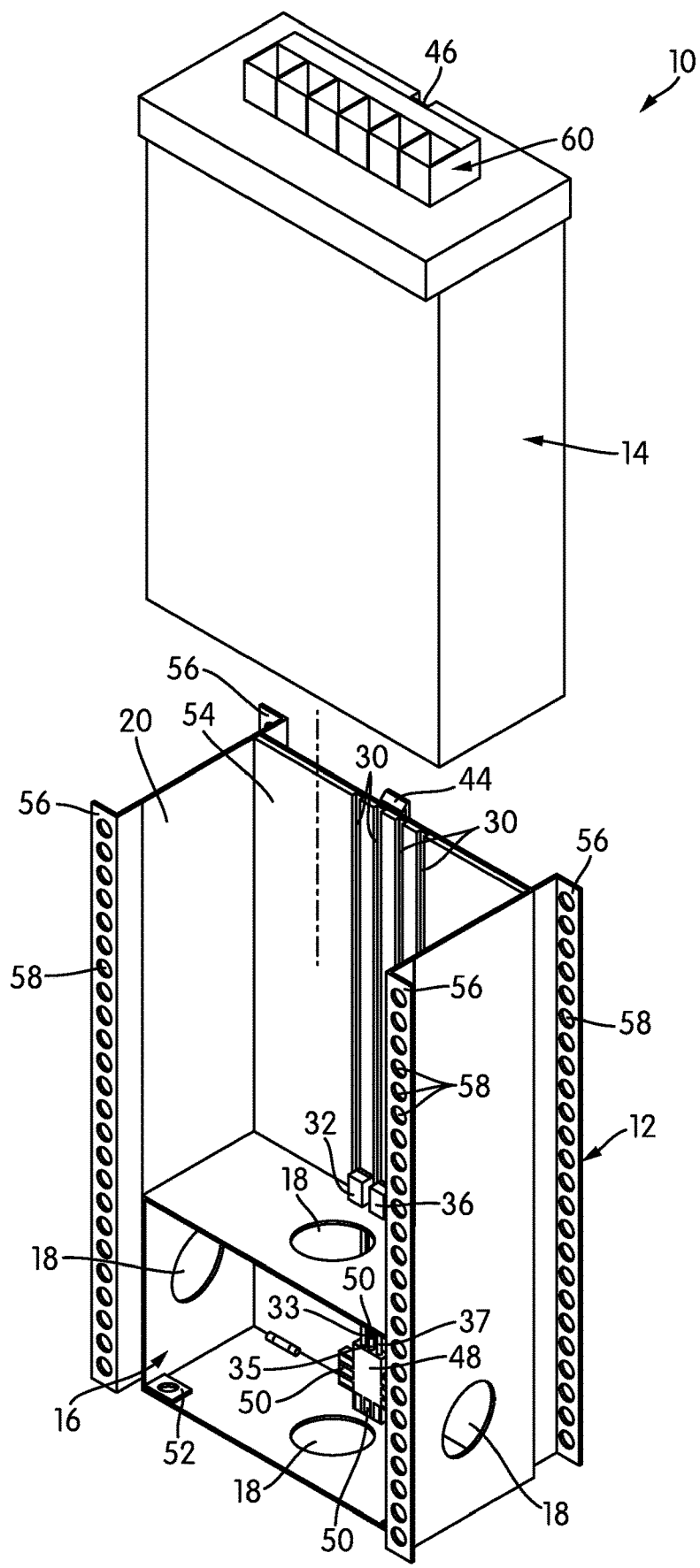
FIG. 1 is an exploded perspective view of an interchangeable driver power system according to one embodiment of the invention.

FIG. 1 is an exploded perspective view of an interchangeable driver power system, generally indicated at 10, according to one embodiment of the invention. The interchangeable driver power system 10 includes any number of receptacles 12 and any number of drivers 14, although for simplicity, one receptacle 12 and one driver 14 are shown in the view of FIG. 1.

Here, the term "driver" should be construed to have the meaning ascribed to it above—a component that takes power in a first form and outputs power in a second form, different from the first. While aspects of this description may assume that the conversion performed by the driver 14 is a high-voltage AC to low-voltage DC conversion, drivers according to embodiments of the invention may perform any type of power conversion. Additionally, although the definitions of "high voltage" and "low voltage" vary according to the authority one consults, for purposes of this description, "high voltage" should be considered to be any voltage over 50V.

In system 10, the receptacle 12 provides junction box structure, including at least one compartment 16 where electrical connections can be made. As will be described below in more detail, that compartment 16 may have openings, or knock-outs 18 for openings, along one or more sides. In a conversion from high-voltage power to low-voltage power, the compartment 16 would generally house the high-voltage connections.

The receptacle 12 also receives and connects to the driver 14 both mechanically and electrically in some fashion, usually by electrical contacts and a latching mechanism that allow the driver 14 to be quickly removed from the receptacle 12 and replaced if needed. The mechanism is such that mechanical and electrical connections are made together, with no additional steps necessary to make an electrical connection once a mechanical connection between the receptacle 12 and the driver 14 has been made. In the illustrated embodiment, the receptacle 12 is a rectilinear enclosure with an open side or end 20, and the driver 14 is similarly rectilinear and has a shape complementary to that of the open receptacle 12 such that the driver 14 is physically received in the receptacle.

Generally speaking, during the design and installation of a system 10 according to an embodiment of the invention, the receptacles 12 are laid out and installed in the necessary locations, with electrical connections made within the compartments 16 defined by the receptacles 12. The drivers 14 are interchangeable parts that can be quickly inserted into and removed from the receptacles 12.

Preferably, a wide variety of drivers 14 of different power capacities are able to fit within and engage the receptacles 12. Many of these drivers 14 will have the same physical size and dimensions, regardless of their power capacities, but not all drivers 14 need have the same size and dimensions, so long as they can fit within and engage the receptacles 12.

Figure 2:
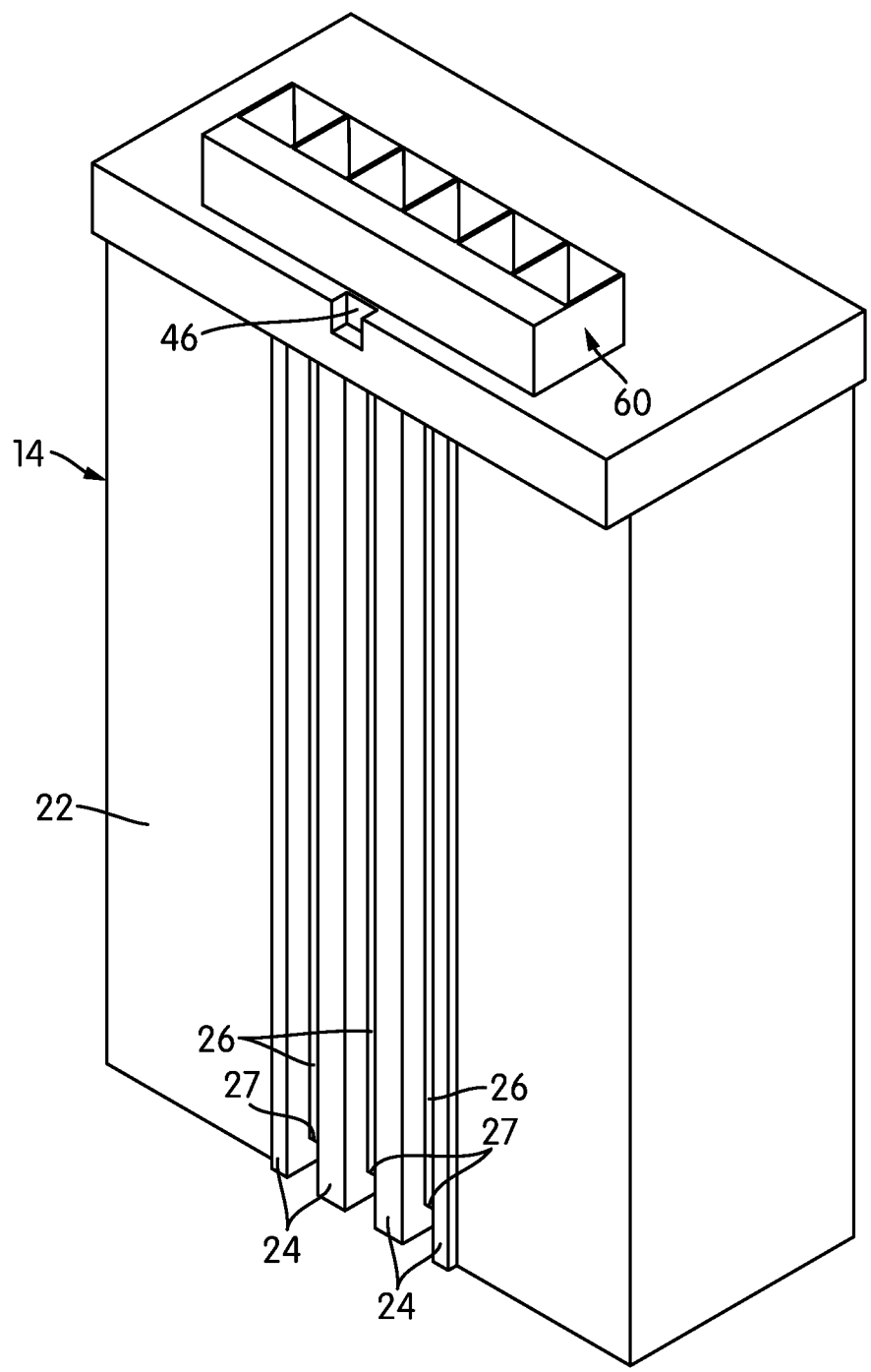
FIG. 2 is a perspective view of the driver in the system of FIG. 1.

FIG. 2 is a perspective view of the driver 14 in isolation. On its bottom face 22, the driver 14 has a series of interdigitated raised rails 24 and inset grooves 26, in this case, four rails 24 and three grooves 26. The rails 24 correspond to grooves 30 inset into the bottom of the receptacle 12. The rails 24 and grooves 26 in the driver 14 run substantially its entire length.

Figure 3:
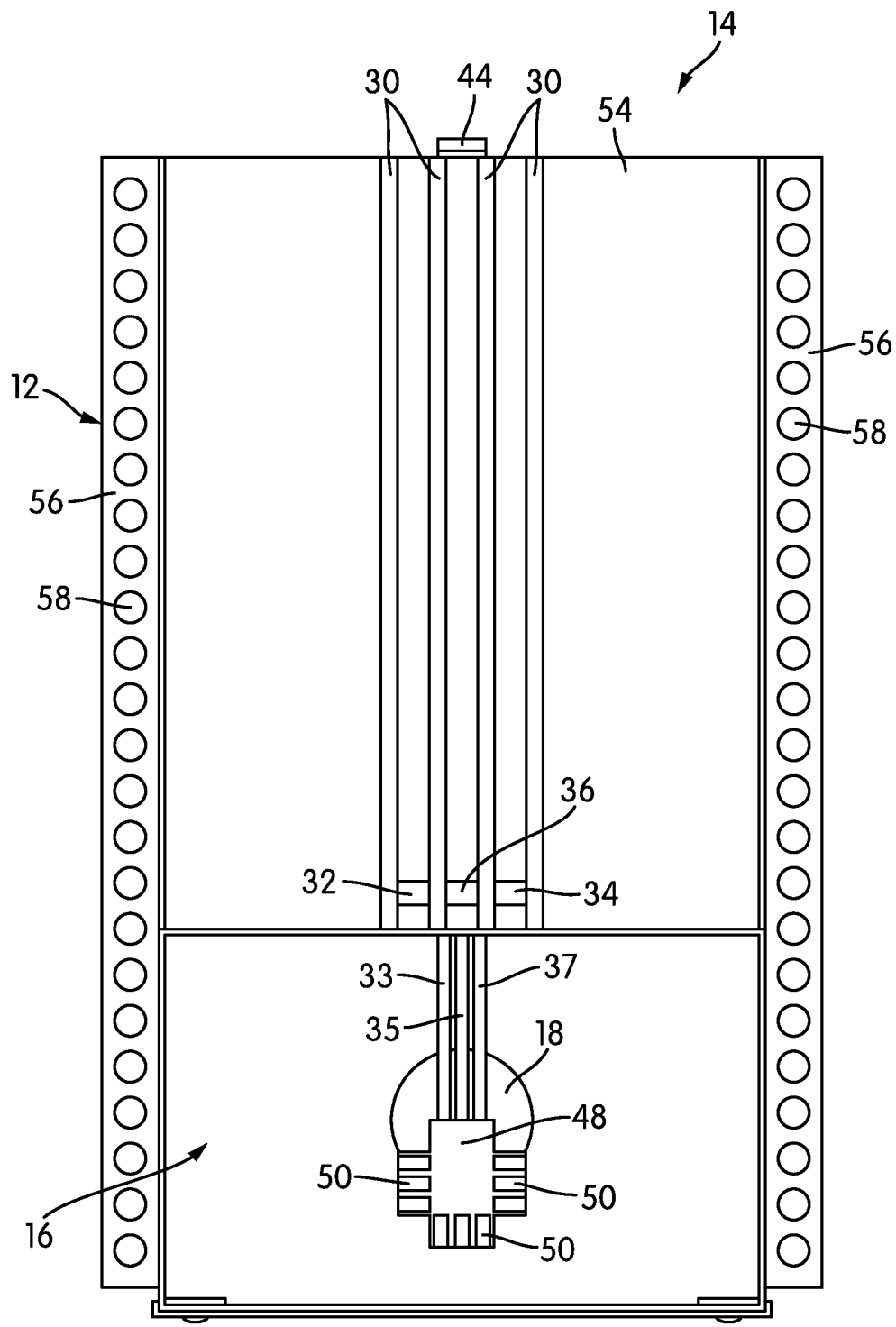
FIG. 3 is a front elevational view of the receptacle in the system of FIG. 1.

FIG. 3 is a front elevational view of the receptacle 12. As shown, there are corresponding grooves 30 in the receptacle 12 that receive the rails 24 of the driver 14 and run a corresponding length. At the end of the grooves 30 proximate to the compartment 16, the receptable 12 has a set of three terminals 32, 34, 36; these contact conductors inset into the grooves 26. Typically, these terminals 32, 34, 36 carry high-voltage line, neutral, and ground, but there may be any number of terminals, and in various embodiments, they may be of any type.

The driver 14 may be placed within the receptacle 12 by sliding, pushing, a combination of sliding and pushing, or by application of force in some other way. Once in place, the driver 14 may be held there by a latching mechanism or by other, similar structure. For example, the illustrated embodiment includes a retaining prong 44 that cooperates with and latches onto a retaining notch 46 on the driver 14.

The electrical connection between the receptacle 12 and the driver 14 may be made by any kind of electrical contacts. However, those electrical contacts will typically not be loose wires that must be joined individually to other wires. Rather, in system 10, the electrical connections between the receptacle 12 and the driver 14 are made when the two components 12, 14 are physically connected, without any additional steps necessary to make an electrical connection. For example, electrical contacts 27 would typically be set into the ends of the grooves 26, such that electrical contact is made between the electrical contacts 27 on the driver 14 and the contacts 32, 34, 36 on the receptacle 12 when the receptacle 12 and driver 14 are mechanically engaged with one another. In some cases, the electrical contacts 27 may extend for the entire lengths of the grooves 26; in other cases, the electrical contacts 27 may extend only over a short area, with the majority of each groove 26 serving only an alignment or other mechanical engagement function. As those of skill in the art will appreciate, in a high-voltage AC to low-voltage DC conversion, the electrical contacts 27 would typically serve as high-voltage inputs to the driver 14.

In the system 10 of FIGS. 1 and 2, high-voltage input power connections are made within the compartment 16 of the receptacle 12. In other words, the compartment 16 serves the role of a conventional junction box in providing a space to connect a high-voltage power supply cable to the inputs of the driver 14.

As was noted above, in order to make connections with power supply cables, an opening or potential opening 18 is formed in at least one wall of the compartment 16. A "potential" opening may be in the form of a knock-out, a frangible or scored portion of metal or plastic that can be broken away, either manually or with a tool, to form an opening.

The terminals 32, 34, 36 within the receptacle 12 that connect electrically to the driver 14 to provide it with input power are electrically connected to conductors within the compartment 16 that make electrical connections with a power supply cable. Those conductors may be wires that are permanently connected to the terminals 32, 34, 36 and extend into the compartment 16. However, in the illustration of FIGS. 1 and 2, there are three wires 33, 35, 37 that are electrically connected to the terminals 32, 34, 36 on one end and to a connector 48 within the compartment 16 on the other end. The connector 48 has sets of terminal block-like openings 50 on three sides. Incoming wires would enter through an opening 18 and connect to the connector 48 using the openings 50.

Instead of terminal blocks 50, in some cases, connections between compartment wires 33, 35, 37 and incoming supply wires may be made by wire nut, lever nut, or other such electrical connector. The compartment 16 also includes a grounding tab 52 sized and adapted to accept a screw to secure a ground wire. The grounding tab 52 is shown as folded against a sidewall of the compartment 16, but may be bent out perpendicular to the sidewall. If a grounding tab 52 is used, an incoming ground wire from the power supply cable may be connected both to the receptacle 12 through the grounding tab 52 and to its counterpart in the compartment wires 33, 35, 37 such that the driver 14 is also grounded when connected.

Typically, the compartment 16 would be covered by a cover, which may be secured by screws or other fasteners to flanges on the sidewalls of the compartment 16. Alternatively, a cover may slide into grooves provided near the compartment 16. By contrast, in many cases, there may be no cover required over the driver 14. Rather, the driver 14 and the receptacle 12 engage in such a way that they form an enclosed unit. The enclosed unit formed by the interengaged receptacle 12 and driver 14 would typically have the benefit of sufficiently isolating the various power conductors and wires as to comply with whatever local safety regulations are applicable.

In most cases, the receptacle 12 will have a number of different structures allowing it to be mounted in different locations. In the illustrated embodiment, the receptacle 12 has an H-shaped cross-section overall, such that the common base 54 that serves as the floor of the receptacle 12, carries the grooves 30, and acts as the floor of the compartment 16 is the cross-member of the H. An attachment rail 56 protrudes from each corner of the receptacle 12. Each rail 56 is provided with a number of fastener openings 58, providing a number of options for how the receptacle 12 is mounted. In this particular embodiment of the invention, the H-shaped cross-section attachment rails 56 cause the receptacle 12 and any connected driver 14 to "stand off" from the surfaces on which they are mounted, providing for greater airflow under and around the assembled system.

Low voltage output connections to the driver 14 may be made in any number of ways. In some embodiments, a second compartment similar to the compartment 16 described above may be provided to allow space for making such low-voltage connections. The question of whether or not a second compartment is present is usually influenced or dictated by safety regulations, which vary by jurisdiction. Generally speaking, though, safety regulations are more relaxed for low voltages, and thus, it may not be necessary to enclose the connections. Reflecting that, the driver 14 has a terminal block 60 for low voltage output connections. Typically, low-voltage terminals include at least a positive terminal and a minus-return terminal, although some embodiments may include a ground terminal as well. The terminal block 60 may have multiple sets of output terminals, although that will often depend on the power capacity of the driver 14. A driver 14 capable of supplying a larger amount of power will typically have a terminal block 60 with more than one set of terminals, so that multiple loads may be powered at any one time.

In the illustrated embodiment, the receptacle 12 is made of metal, and in particular, by bending sheet metal. When using sheet metal, if needed, the corners of the structure may be brazed, welded, or otherwise joined. In other embodiments, the receptacle 12 could be made of a plastic. The outer casing of the driver 14 may be made of either plastic or metal. As will be explained below in more detail, when plastics are used in electrical applications like this, they are often required by local safety regulations to have particular flame ratings and other safety ratings.

In the embodiment of FIGS. 1-3, the receptacle 12 is larger than the driver 14 and thus reserves all of the space required for the driver 14. This may be useful in some embodiments, if it is necessary to reserve space for the driver 14, e.g., within a wall or in a small, easily-filled space. That said, it may not be necessary for the receptacle 12 to have those dimensions.

Figure 4:
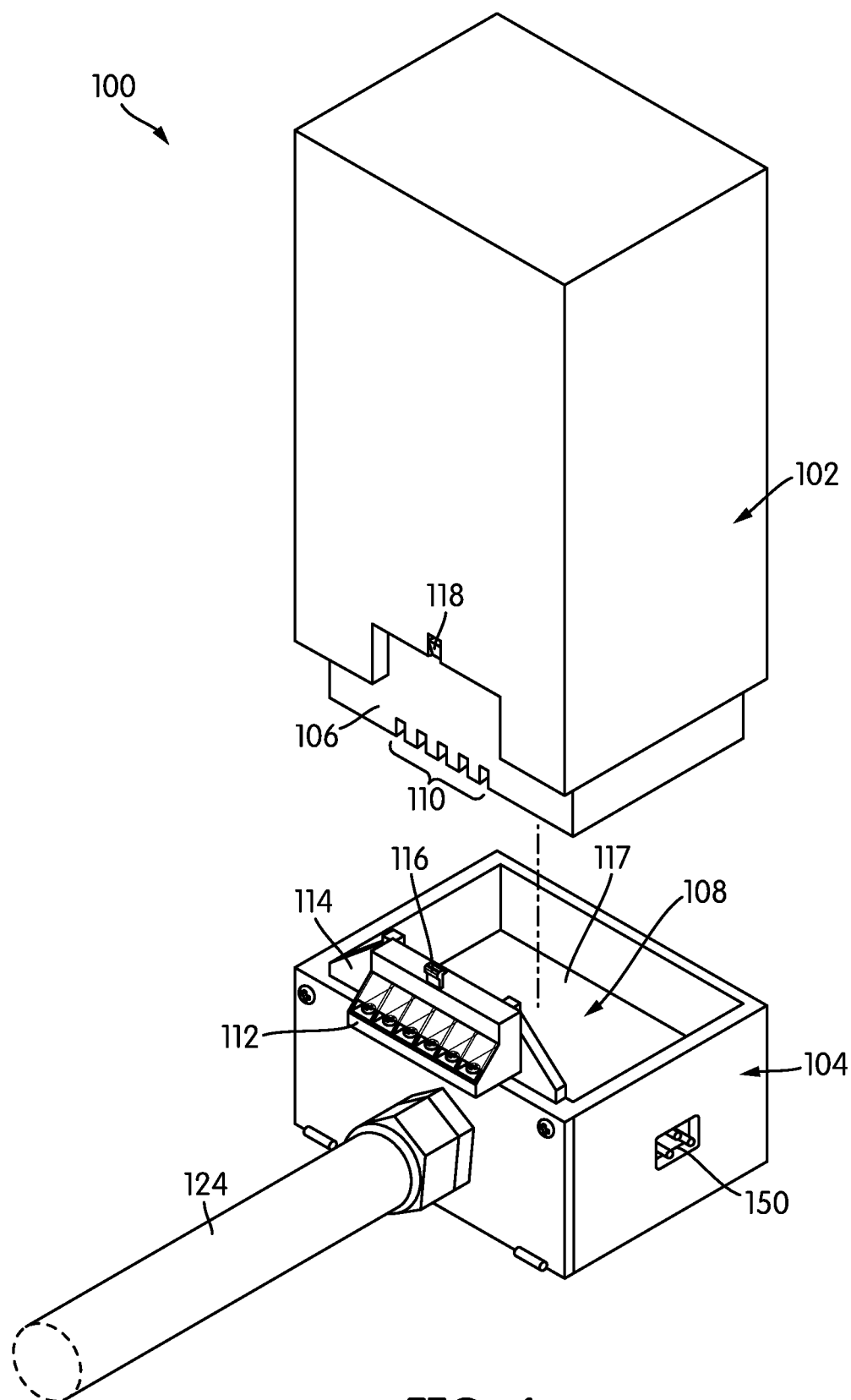
FIG. 4 is an exploded perspective view of an interchangeable driver power system according to another embodiment of the invention.

FIG. 4 is an exploded perspective view of an interchangeable driver system, generally indicated at 100, according to another embodiment of the invention. This interchangeable driver system 100 also includes a driver 102 and a receptacle 104, although the configuration of both elements is different than in the embodiment described above.

The driver 102 is again rectilinear in overall shape and construction, although the driver 102 defines a connection area 106 toward its bottom (i.e., toward one end) that is stepped down in width and depth in order to connect with the receptacle 104. As will be described below in more detail, the driver 102 provides male connecting structure in this embodiment, and the receptacle 104 provides complementary female connecting structure. However, that need not be the case in all embodiments.

The receptacle 104 of this embodiment has the form of a short base for the driver 102. Its upper portion is an open socket 108 that is sized and otherwise adapted to receive the connection area 106 of the driver 102.

A set of terminals 110 provided on the forward lower edge of the driver 102 makes all of the necessary electrical connections with the driver 102—including both input and output connections—when the driver 102 and the receptacle 104 are mechanically connected. The set of terminals 110 typically includes input power and neutral and output power and return, in addition to a ground terminal. However, the terminals that are provided in any particular set of terminals 110 will typically depend on the type of power conversion that the driver 102 performs. Additionally, while placing all of the terminals 110 in the same area may be a convenience, in some embodiments, input and output terminals may be physically separated from one another.

Figure 5:
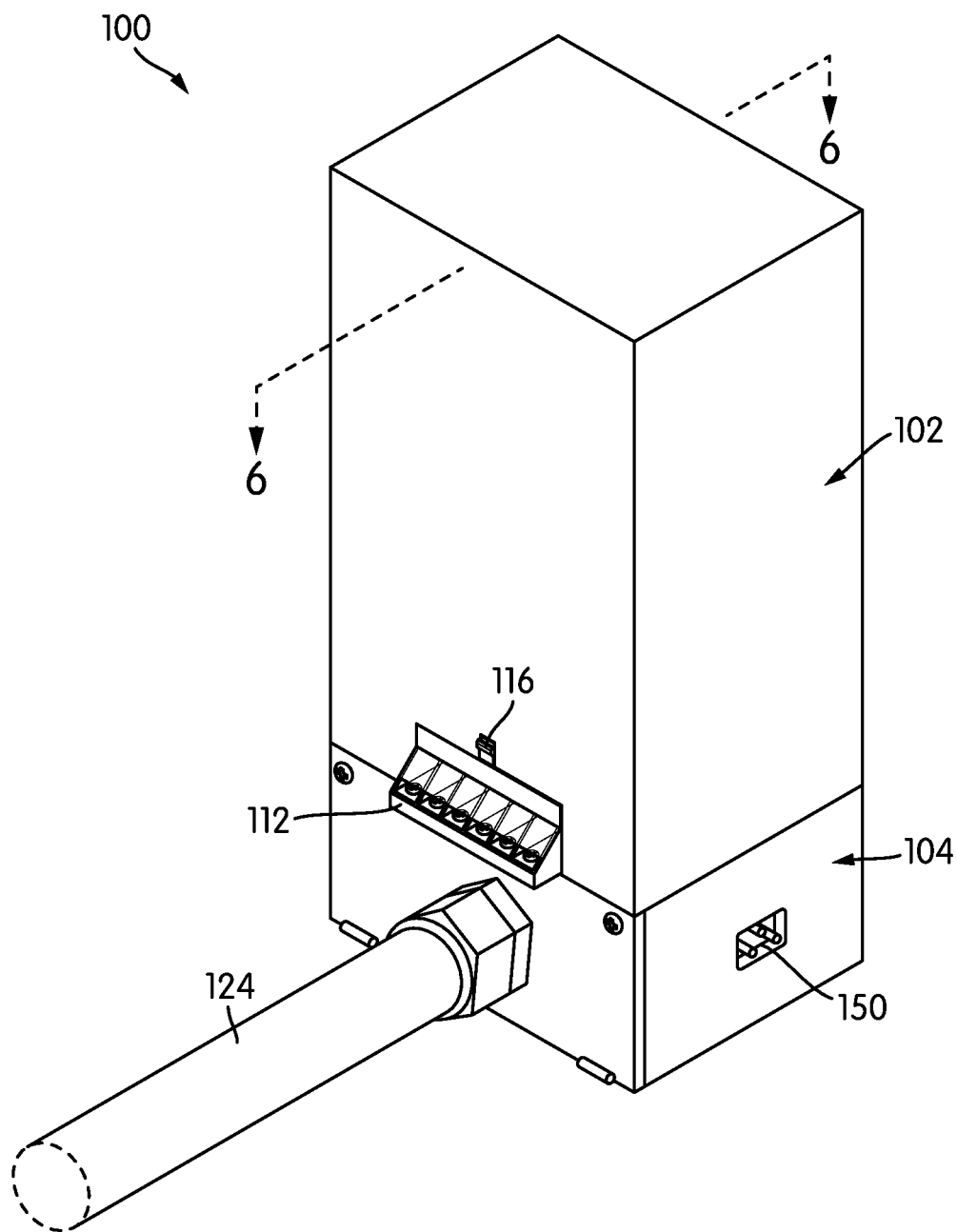
FIG. 5 is an assembled perspective view of the system of FIG. 4.

A set of output terminals 112 is provided on a riser 114 at the front of the receptacle 104. That riser 114 also carries latch structure 116 that engages a retaining notch 118 or other complementary engaging structure on the driver 102. FIG. 5 is a perspective view illustrating the driver 102 fully engaged with the receptacle 104. As shown in FIG. 5, the driver 102 and receptacle 104 fit snugly together, with no large gaps in the illustrated embodiment. The fit between the driver 102 and the receptacle 104 may be a relatively tight fit. Moreover, when the driver 102 and the receptacle 104 are engaged, the high-voltage connections between driver 102 and receptacle 104 are electrically isolated within the socket 108 of the receptacle 102, as will be described below in more detail.

Figure 6:
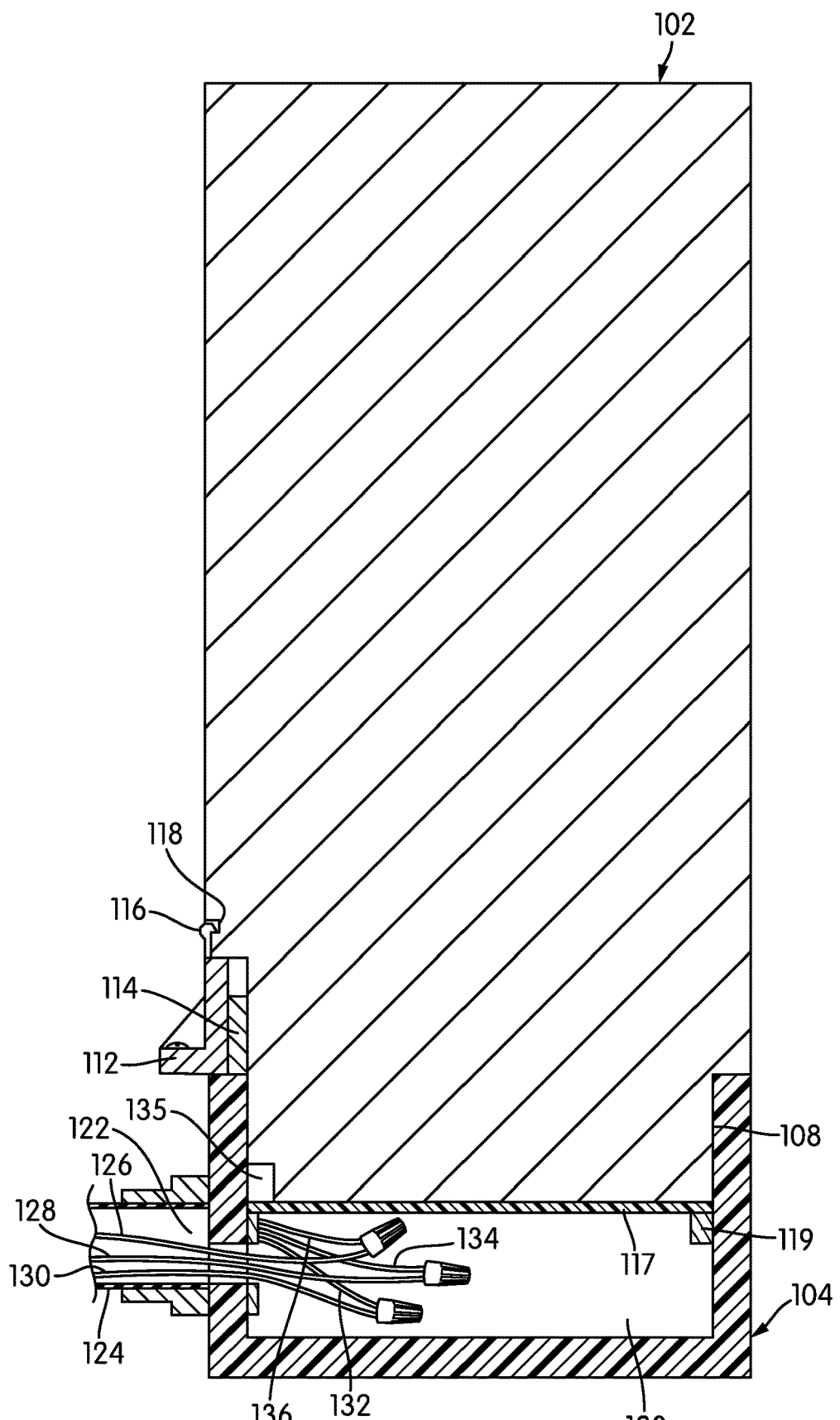
FIG. 6 is a cross-sectional view taken through Line 6-6 of FIG. 5.

FIG. 6 is a cross-sectional view taken through Line 6-6 of FIG. 5. As shown in FIG. 6, the socket 108 is the upper portion of the receptacle 104. The floor of the socket 108 is a removable divider panel 117 that rests on an inwardly-extending flange 119. A lower compartment 120 is defined between the interior bottom of the receptacle 104 and the divider panel 117. The lower compartment 120 provides a dedicated space for wire connections. Typically, because of applicable safety regulations, if the power conversion performed by the driver 102 is a high-voltage to low-voltage conversion, the lower compartment 120 will be used for high-voltage wire connections.

More specifically, the forward wall of the receptacle 104 in this embodiment includes an opening 122, or in some cases, a knock-out for an opening, as was described above. A cable 124 can be connected to or around the opening 122 using conventional clamps, flanges, and other such structures. The position of the opening 122 is set so that high voltage wires 126, 128, 130 from the cable 124 enter the lower compartment 120.

The lower compartment 120 also includes a set of wires 132, 134, 136 of its own. The set of wires 132, 134, 136 internal to the lower compartment 120 are electrically connected to the set of terminals 135 in the receptacle 104 that make electrical contact with the set of terminals 110 of the driver 102. The set of wires 132, 134, 136 are permanently connected at one end to the set of terminals 135. The free ends of the set of wires 132, 134, 136 protrude from the forward wall of the lower compartment 120, as can be seen in FIG. 6. The set of wires 132, 134, 136 internal to the compartment 120 act as high-voltage input wires, connected to the wires 126, 128, 130 of the power input cable 124. Wire nuts, lever nuts, and other such conventional electrical joining structures can be used to make the connections between wires 126, 128, 130, 132, 134, 136.

In many embodiments, the output terminals 112 carried by the receptacle 104 will be low-voltage terminals. Because the output terminals 112 are carried by the receptacle 104, rather than the driver 102, the power outputs of the driver 102 are conveyed from the set of terminals 110 on the driver 102 to the terminals 135 in the socket 108 of the receptacle 102. To do this, individual terminals 135 from the set of terminals in the socket 108 are connected to the terminals 112 on the riser 114 of the receptacle 104. In other embodiments, the power output terminals may be located on the driver, which avoids the necessity of routing power outputs through the receptacle 104.

In this description, it is assumed that the driver 102 has only a single power output circuit that provides a single set of outputs. That single set of outputs is then connected to as many sets of terminals (i.e., as many different loads) as needed, subject only to the maximum power output capability of the driver 102. This is the usual configuration of most drivers—a single set of outputs powered by a single power conversion circuit within the driver 102. However, some drivers may have multiple, independent power conversion circuits, each of which is connected to its own independent set of power outputs. Embodiments of the invention may be made to accommodate this arrangement.

Although the opening 122 in the receptacle 104 is along its front face in the illustrated embodiment, the receptacle 104 may have openings 104, or knock-outs for openings, along any face. In some embodiments, openings 122 may be provided along several faces, although in some cases, if more openings 122 are provided, the lower compartment 120 may need to be larger.

With the arrangement of the interchangeable driver system 100, an installer can set the receptacles 104 in place, wire connections between high-voltage supply wires 126, 128, 130 and the receptacle 104 as usual, and then drop the divider 117 in place. If necessary or desirable, the divider 117 could be secured by screws or other such fasteners. When it comes time to install a driver 102, the driver 102 simply snaps in place within the socket 108 of the receptacle 104. Electrical connections between the driver 102 and the receptacle 104 are made automatically as a consequence of the set of contacts 110 being seated in the complementary set of contacts 136 within the socket 108. As was described above, the output terminal block 112 may have several complete sets of output terminals, especially if the driver 102 has a larger power capacity and is capable of serving multiple loads simultaneously.

While the divider 117 is shown as extending horizontally to divide the receptacle into the socket 108 and the lower compartment 120, this may differ from embodiment to embodiment. Access to the compartment in which input electrical connections is made may be through any face or wall of the receptacle.

As can be seen particularly in FIGS. 4 and 5, the receptacle 104 has an additional feature: a receptacle or plug 150 with several terminals. The plug 150 shown in FIGS. 4-5 is female, although it may be male in other embodiments. Typically, the plug 150 would have a complementary counterpart on the opposite face of the receptacle 150. These plugs would allow an installer to connect several receptacles 104 together, side-by-side, as shown in the perspective view of FIG. 7. This kind of "daisy-chained" side-by-side connection may be helpful when there are a large number of loads that need to be connected to drivers 102 in the same area. While the two plugs 150 are on opposite faces in the illustrated embodiment, they could be on adjacent faces—or on all faces—in other embodiments.

Figure 7:
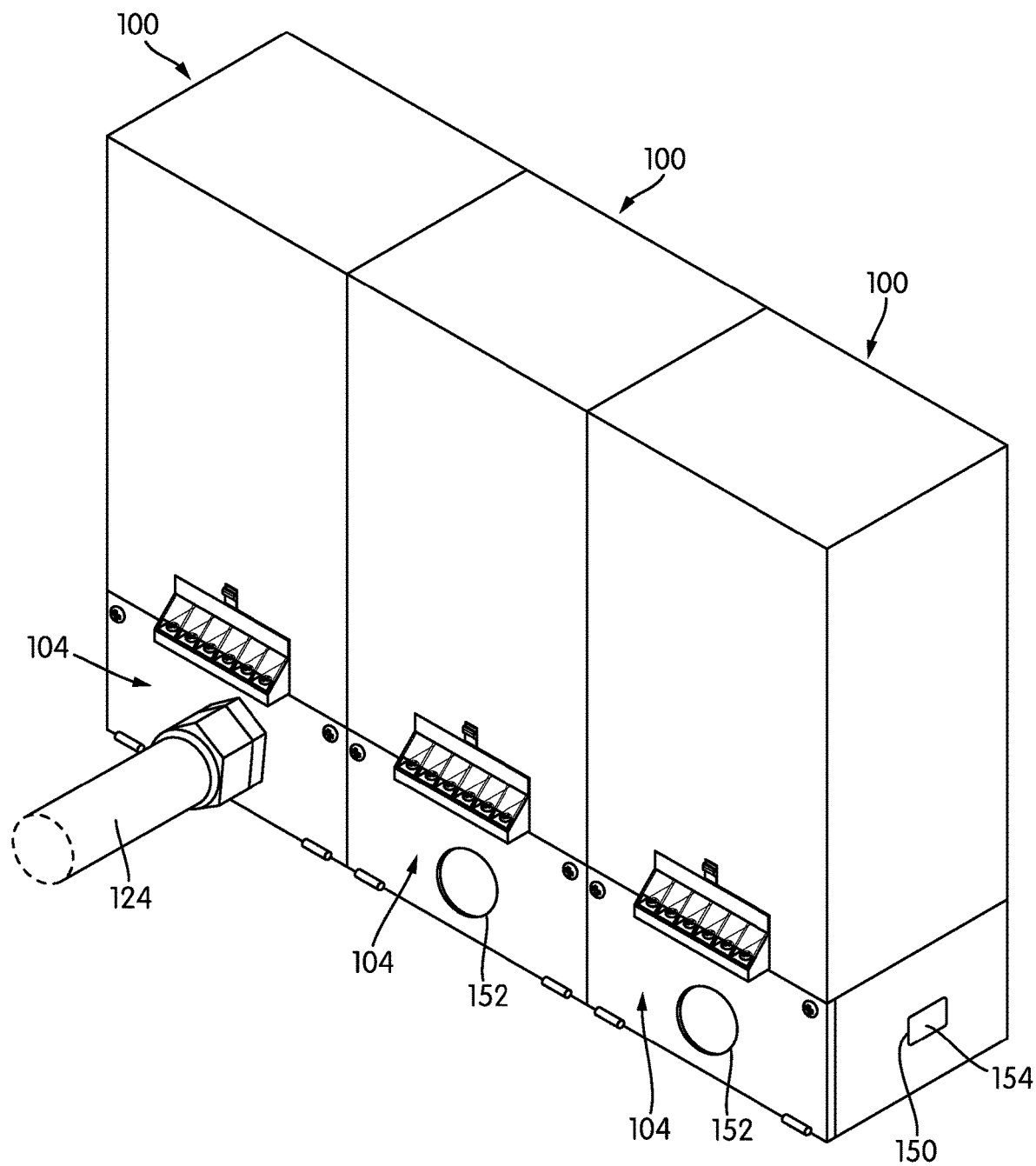
FIG. 7 is a perspective view illustrating several of the systems of FIG. 4 used together in connected fashion.

Another advantage can be discerned from FIG. 7 as well: when several receptacles 104 are connected together, only one receptacle 104 need be wired to an input power cable 124. The other receptacles 104 may draw their power inputs from the connected receptacles 104 through the plugs 150. As shown, while one receptacle 104 is wired to an input power cable 124, the other two receptacles 104 have unbroken knock-outs 152 in place. When not in use, an open plug 150 may be capped with a suitable cap 154, as the plug 150 on the right of FIG. 7 is.

The arrangement shown in FIG. 7 cuts down on the amount of wiring that an installer would need to do in a typical arrangement. In some cases, joined receptacles 104 may have additional mechanical securing structure, such as latching systems or fasteners, to bind them together, such that the frictional, push-in connection of the plugs 150 is not the only thing that binds the receptacles together.

As with the system 10 described above, the drivers 102 of system 100 may have the same size regardless of the amount of power they can handle, meaning that the amount of space required for them is predictable and can be accounted for at the time that the receptacles 104 are installed. However, in some cases, the drivers 102 may have different sizes but the same connection area 106, allowing them to connect interchangeably with the receptacles 104.

Generally speaking, the receptacles 104 may be made of metal, plastic, or any other suitable material. The drivers 102 may similarly have an outer casing and features that are made of either metal or plastic. If a component is made of a plastic, typically, the plastic will be adapted and rated to handle flames. For example, the plastic may be rated as 5VA according to the UL 94 standard, which is harmonized with a number of international standards.

In both of the systems 10, 100 illustrated above, the output terminals 60, 112 are located on an exterior face of the driver 14 or the receptacle 104. That need not always be the case. The positioning of the output terminals 60, 112 shown in the figures may be ideal if the outputs are, e.g., low-voltage DC power. However, if the output is intended to be high-voltage AC or another type of power that requires more safety precautions, for example, the outputs could be wires, and a separate compartment could be provided for making output connections. As was described above, output connections may be placed anywhere, either on the driver 14, 102 or on the receptacle 12, 104.

While the invention has been described with respect to certain embodiments, the description is intended to be exemplary, rather than limiting. Modifications and changes may be made within the scope of the invention, which is defined by the appended claims.

What is claimed is:

1. An interchangeable driver system, comprising:
   a driver having a first set of terminals, the driver configured to receive power in a first form and output power in a second form that is different from the first form; and
   a receptacle having
      a first compartment adapted to releasably and interchangeably mechanically and electrically engage the driver, the first compartment having a second set of terminals adapted to engage the first set of terminals of the driver, and a second compartment separated from the first compartment, the second compartment having a set of electrical connections that are electrically connected to the second set of terminals of the first compartment;

wherein the engagement of the receptacle and the driver is such that electrical and mechanical connections are made together.

2. The interchangeable driver system of claim 1, further comprising complementary securing structure disposed on the driver and the receptacle to secure the driver and the receptacle together.

3. The interchangeable driver system of claim 2, wherein the complementary securing structure comprises latch structure.

4. The interchangeable driver system of claim 1, wherein the set of electrical connections comprise wires.

5. The interchangeable driver system of claim 4, wherein the wires terminate in a terminal block.

6. The interchangeable driver system of claim 1, the receptacle comprising at least three walls sized and arranged to surround the driver.

7. The interchangeable driver system of claim 1, wherein the receptacle comprises a base for the driver.

8. The interchangeable driver system of claim 1, wherein the second compartment comprises one or more exterior openings or knock-outs for openings.

9. The interchangeable driver system of claim 1, further comprising outputs on the driver or the receptacle, the outputs electrically connected to the driver.

10. The interchangeable driver system of claim 1, the receptacle further comprising one or more attachment rails with one or more fastener openings, the one or more attachment rails extending away from a body of the receptacle.

11. An interchangeable driver system, comprising:
a driver having a connecting portion with a set of input terminals, and a set of outputs separate from the connecting portion, the driver configured to receive power in a first form and output power in a second form that is different from the first form; and
a receptacle having
a socket adapted to releasably and interchangeably engage the connecting portion of the driver, the socket having a set of socket terminals adapted to engage the set of input terminals of the driver, and
a second compartment separated from the socket, the second compartment having a set of electrical connections that are electrically connected to the set of socket terminals.

12. The interchangeable driver system of claim 11, wherein the second compartment includes one or more exterior openings or knock-outs for openings.

13. The interchangeable driver system of claim 11, wherein a first outer sidewall of the receptacle contains first electrical connecting structure and a second outer sidewall of the receptacle contains second electrical connecting structure.

14. The interchangeable driver system of claim 13, wherein the arrangement of the first electrical connecting structure and the second electrical connecting structure is such that several of the receptacles can be connected together side-by-side in a receptacle bank.

15. The interchangeable driver system of claim 14, wherein only one of the receptacles in the receptacle bank receives an input power cable through an exterior opening in a wall of the second compartment.

16. The interchangeable driver system of claim 11, wherein the set of outputs of the driver supply low-voltage DC power.

17. The interchangeable driver system of claim 16, wherein the set of socket terminals are configured to supply high-voltage AC power.

18. An interchangeable driver system, comprising:
a set of power inputs;
a set of power outputs;
a driver having a first set of terminals, the first set of terminals connecting the driver electrically between the set of power inputs and the set of power outputs to accept power in a first form from the set of power inputs and provide the power to the set of power outputs in a second form, different from the first form; and
a receptacle having
a first compartment adapted to releasably and interchangeably mechanically and electrically engage the driver, the first compartment having a second set of terminals adapted to engage the first set of terminals of the driver, and
a second compartment separated from the first compartment, the second compartment having a set of electrical connections that are electrically connected to the second set of terminals of the first compartment, such that the set of electrical connections that are electrically connected to the second set of terminals of the first compartment serve as the set of power inputs;

wherein the engagement of the receptacle and the driver is such that electrical and mechanical connections are made together.

19. The interchangeable driver system of claim 18, wherein the set of power outputs are carried by the driver.

20. The interchangeable driver system of claim 18, wherein the set of power outputs are carried by the receptacle.

* * * * *